United States Patent
Anderson et al.

(10) Patent No.: US 6,500,734 B2
(45) Date of Patent: *Dec. 31, 2002

(54) GAS INLETS FOR WAFER PROCESSING CHAMBER

(75) Inventors: Roger N. Anderson, San Jose, CA (US); Peter W. Hey, San Jose, CA (US); David K. Carlson, Santa Clara, CA (US); Mahalingam Venkatesan, San Jose, CA (US); Norma Riley, Pleasanton, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 74 days.

(21) Appl. No.: 09/325,597

(22) Filed: Jun. 2, 1999

(65) Prior Publication Data

US 2002/0025657 A1 Feb. 28, 2002

Related U.S. Application Data

(60) Division of application No. 08/485,058, filed on Jun. 7, 1995, which is a continuation-in-part of application No. 08/099,977, filed on Jul. 30, 1993, now abandoned.

(51) Int. Cl.[7] .......................... H01L 21/20; H01L 21/36
(52) U.S. Cl. ......................................... 438/478; 438/492
(58) Field of Search .............................. 438/478, 480, 438/482, 488, 492, 508; 118/715, 725

(56) References Cited

U.S. PATENT DOCUMENTS

| 3,901,182 A | | 8/1975 | Chiang |
| 4,142,004 A | * | 2/1979 | Hauser, Jr. et al. ......... 438/792 |
| 4,223,048 A | | 9/1980 | Engle, Jr. |
| 4,315,479 A | | 2/1982 | Toole et al. |

(List continued on next page.)

FOREIGN PATENT DOCUMENTS

| EP | 0473067 A1 | 8/1991 |
| EP | 0550058 A3 | 12/1992 |
| EP | 0550058 A2 | 12/1992 |
| EP | 0637058 A1 | 7/1994 |
| JP | 60189928 | 3/1984 |
| JP | 3281780 | 3/1990 |

*Primary Examiner*—Michael Sherry
*Assistant Examiner*—Asok Kumar Sarkar
(74) *Attorney, Agent, or Firm*—Blakely Sokoloff Taylor & Zafman

(57) ABSTRACT

A system for supplying processing fluid to a substrate processing apparatus having walls, the inner surfaces of which define a processing chamber in which a substrate supporting susceptor is located. The system consists of a number of fluid storages, each which stores a separate processing fluid, at least two fluid conduits along which processing fluid flows from the fluid storages to the processing apparatus and a fluid inlet which connects the fluid conduits to the processing chamber. The inlet has a separate fluid passage, corresponding to each of the fluid conduits, formed along it. Each fluid passage opens at or near an inner surface of a wall to define a fluid mixing zone, so that fluid moving along one fluid passage is prevented from mixing with fluid moving along any other passage until reaching the mixing zone.

21 Claims, 5 Drawing Sheets

U.S. PATENT DOCUMENTS

| | | |
|---|---|---|
| 4,699,805 A | 10/1987 | Seelbach |
| 4,748,135 A | 5/1988 | Frijlink |
| 4,817,558 A | 4/1989 | Itoh |
| 4,911,102 A | 3/1990 | Manabe et al. |
| 4,924,807 A | 5/1990 | Nakayama et al. |
| 4,980,204 A | 12/1990 | Fujii et al. |
| 4,982,753 A | 1/1991 | Grebinski, Jr. et al. |
| 5,024,182 A | 6/1991 | Kobayashi et al. |
| 5,070,814 A | 12/1991 | Whiffin et al. |
| 5,156,336 A | 10/1992 | Hammond et al. |
| 5,179,677 A | 1/1993 | Anderson et al. |
| 5,186,756 A * | 2/1993 | Benko et al. ............... 118/730 |
| 5,217,755 A | 6/1993 | Thebault et al. |
| 5,244,501 A | 9/1993 | Nakayama et al. |
| 5,262,356 A | 11/1993 | Fujii |
| 5,269,847 A | 12/1993 | Anderson |
| 5,356,657 A | 10/1994 | Terada et al. |
| 5,383,970 A | 1/1995 | Asabe et al. |
| 5,453,124 A * | 9/1995 | Moslehi et al. ............. 118/715 |
| 5,455,070 A | 10/1995 | Anderson et al. |
| 5,458,918 A | 10/1995 | Hawkins et al. |
| 5,551,982 A | 9/1996 | Anderson et al. |
| 5,916,369 A | 6/1999 | Anderson et al. |

\* cited by examiner

GAS INLETS FOR WAFER PROCESSING CHAMBER

RELATED CASES

This application is a divisional application of Ser. No.: 08/485,058 filed Jun. 7, 1995, presently pending, which is a continuation-in-part of U.S. application Ser. No. 08/099,977 filed on Jul. 30, 1993, now abandoned in the name of Anderson, et al.

BACKGROUND OF THE INVENTION

1. Field of the Invention

This invention relates to semiconductor processing apparatus and, more particularly, to a method and apparatus of supplying two different processing gases to a semiconductor wafer processing chamber.

2. Brief Description of the Prior Art

Present-day equipment for the semiconductor industry is moving toward single substrate processing because processing chambers can be made smaller and processing can be better controlled. Further, modern semiconductor vacuum processing systems have been developed to carry out more than one processing step on a substrate without removing the substrate from a vacuum environment. The use of such vacuum systems results in a reduced number of particulates that contaminate the surface of the wafer during processing, thereby improving the device yield.

A typical example of a modern CVD processing apparatus is shown in FIG. 1. In this figure, a single substrate reactor 10 is shown to include a top 12, side walls 14 and a lower portion 16 that, together, define a chamber 18 into which a single substrate, such as a silicon wafer 20, can be loaded. The wafer 20 is mounted on a susceptor 22 that can be rotated by a drive 23 to provide a time-averaged environment for the wafer 20 that is cylindrically symmetric.

A preheat ring 24 is supported in the chamber 18 and surrounds the susceptor 22. The wafer 20 and the preheat ring 24 are heated by light from a plurality of high-intensity lamps, schematically indicated as 26, mounted inside of the reactor 10. The top 12 and lower portion 16 of the reactor 10 are typically made from clear quartz which is transparent to the light from lamps 26. Quartz is generally used to make up the top 12 and lower portion 16 because it is transparent to light of both visible and IR frequencies, because it exhibits a relatively high structural strength and because it is chemically stable in the process environment of the chamber.

During the deposition process, processing gas (whether reactant or dopant) is supplied to the interior of the chamber 18 from an exterior source, schematically represented by two tanks 28. The gas flows from the gas supply 28 along a gas supply line 30 and into the chamber 18 via a gas inlet port 32. From the port 32, the gas flows across the preheat ring 24 where it heats up, across the susceptor 22 and wafer 20 in the direction of the arrows 34, to be evacuated from the chamber 18 through evacuation port 36. The dominant shape of the flow profile of the gases is laminar from the gas input port 32 and across the preheat ring 24 and the wafer 20 to the exhaust port 36, even though the rotation of the wafer 20 and thermal gradients caused by the heat from the lamps 26 do affect the flow profile slightly.

The above-described CVD processing chamber can accommodate a number of different processes taking place. Each process differs, depending on the desired end result, and has different considerations associated therewith.

In the polysilicon deposition process, doped or undoped silicon layers are typically deposited onto the wafer using processes such as low-pressure chemical vapor deposition (CVD). In this process, a reactant gas mixture including a source of silicon (such as silane, disilane, dichlorosilane, trichlorosilane or silicon tetrachloride) and, optionally, a dopant gas (such as phosphine, arsine or diborane) is heated and passed over the wafer to deposit a silicon film on its surface. In some instances, a non-reactant carrier gas, such as hydrogen, is also injected into the processing chamber, together with either or both of the reactant or dopant gases. In this process, the crystallographic nature of the deposited silicon depends upon the temperature of deposition. At low reaction temperatures, the deposited silicon is mostly amorphous; when higher deposition temperatures are employed, a mixture of amorphous silicon and polysilicon or polysilicon alone will be deposited.

One problem with the doped polysilicon deposition is that the temperature dependence of dopant incorporation is the opposite of the temperature dependence of the polysilicon deposition rate. This is because adjusting the temperature to obtain thickness uniformity in the polysilicon layer produces a non-uniform dopant incorporation. This is because the dopant gas has, in the past, been incorporated into the processing gas before it is injected into the chamber. There is therefore no control of the dopant gas flow independent of the flow of the silicon species processing gas.

In another process, the nitride deposition process, a stream of reactant gas, which is a mixture of ammonia ($NH_3$) and any one of the various silane species, is injected into the chamber. These two gases react at room temperature to produce small crystals. In the arrangement shown in FIG. 1, the gas storage 28 is shown to include two tanks, both of which feed into a single supply line 30. If these tanks contained ammonia and silane respectively and the line 30 were at room temperature, this reaction would occur and particles would form along the entire length of the supply line 30 and within the manifold 32. These particles are undesirable, as they are a source of contamination in the chamber 18; and their existence should therefore be eliminated.

In addition, it has been found that some reactant gases pass through the gap between the preheat ring 24 and the susceptor 22. This causes deposition on the back side of the susceptor 22 and on some of the other components in the lower portion of the chamber 18. Such deposition is both wasteful and undesirable, as it requires additional cleaning to remove.

Accordingly, a need has arisen for a system of supplying reactant/dopant gases to a semiconductor processing chamber which overcomes these different problems.

SUMMARY OF THE INVENTION

Summary

Briefly, this invention provides for a system for supplying processing fluid to a substrate processing apparatus having walls, the inner surfaces of which define a processing chamber in which a substrate supporting susceptor is located. The system consists of a number of fluid storages, each of which stores a separate processing fluid; at least two fluid conduits along which processing fluid flows from the fluid storages to the processing apparatus; and a fluid inlet which connects the fluid conduits to the processing chamber. The inlet has a separate fluid passage, corresponding to each of the fluid conduits, formed along it. Each fluid passage opens at or near an inner surface of a wall to together define a fluid mixing zone, so that fluid moving along one fluid passage is prevented from mixing with fluid moving along any other passage until reaching the mixing zone.

Typically, at least two of the fluid passages are vertically displaced from one another to, at least partially, define upper and lower fluid flow paths. The fluid inlet may include a mixing cavity formed at or near the inner surface of the wall so that the mixing zone is defined by the boundaries of the mixing cavity. The mixing cavity may be a generally vertical channel disposed between the upper and lower fluid flow paths.

Alternatively, the chamber can be divided into an upper portion and a lower portion by the susceptor and the upper and lower fluid flow paths arranged respectively to open into the upper and lower portions of the chamber. In this arrangement, the chamber typically includes a susceptor-circumscribing preheat ring which defines an annulus between the chamber and the susceptor. The lower fluid flow path may include the annulus. In operation, processing fluid passing into the lower portion of the chamber will pass through the annulus to mix with processing fluid in the upper portion of the chamber.

The details and advantages of the present invention will, no doubt, become apparent to those skilled in the art after having read the following detailed description of the preferred embodiments which are illustrated in the several figures of the drawing.

IN THE DRAWING

Figure 1:
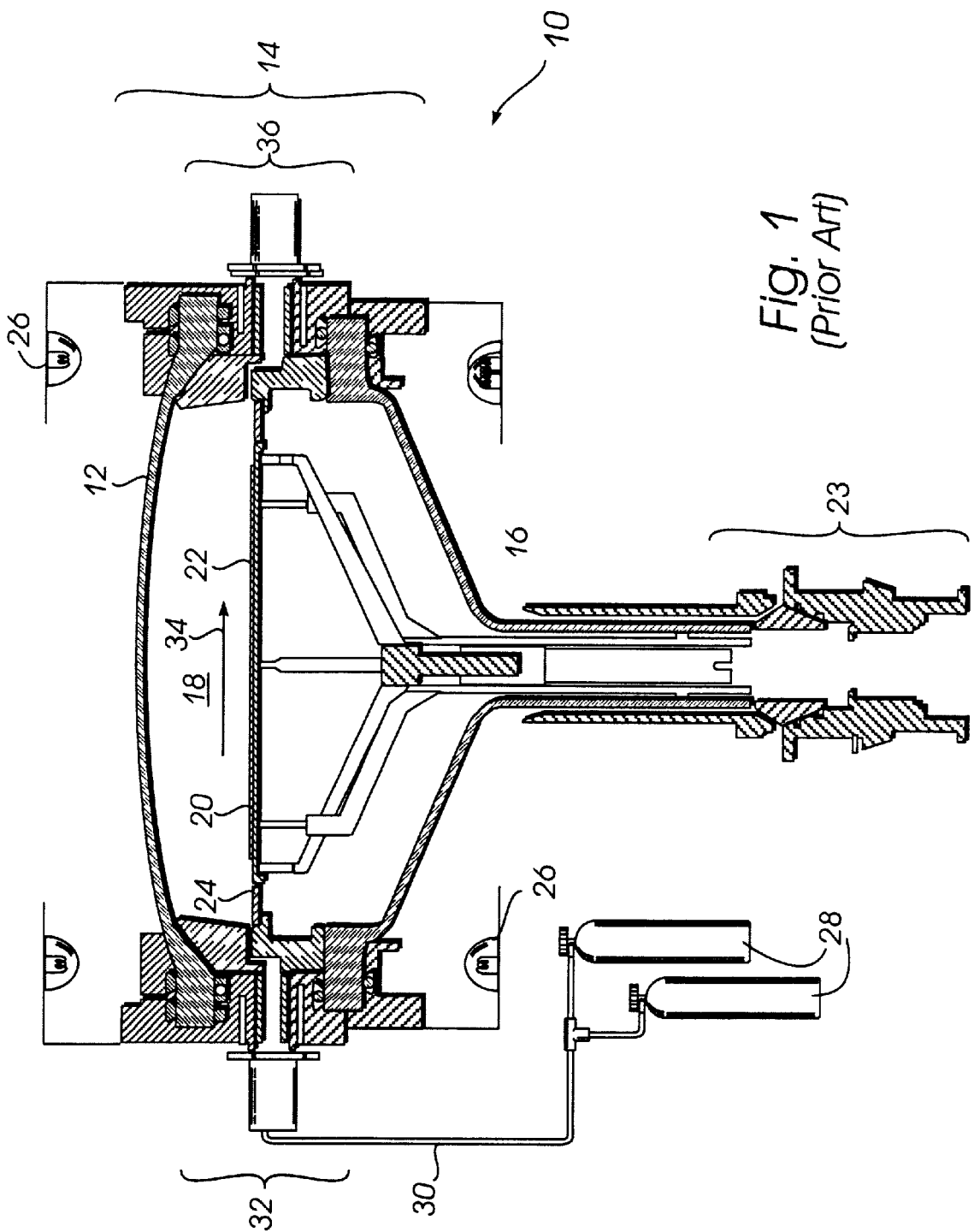
FIG. 1 is a cross section of a prior art CVD semiconductor wafer processing chamber.
Figure 2:
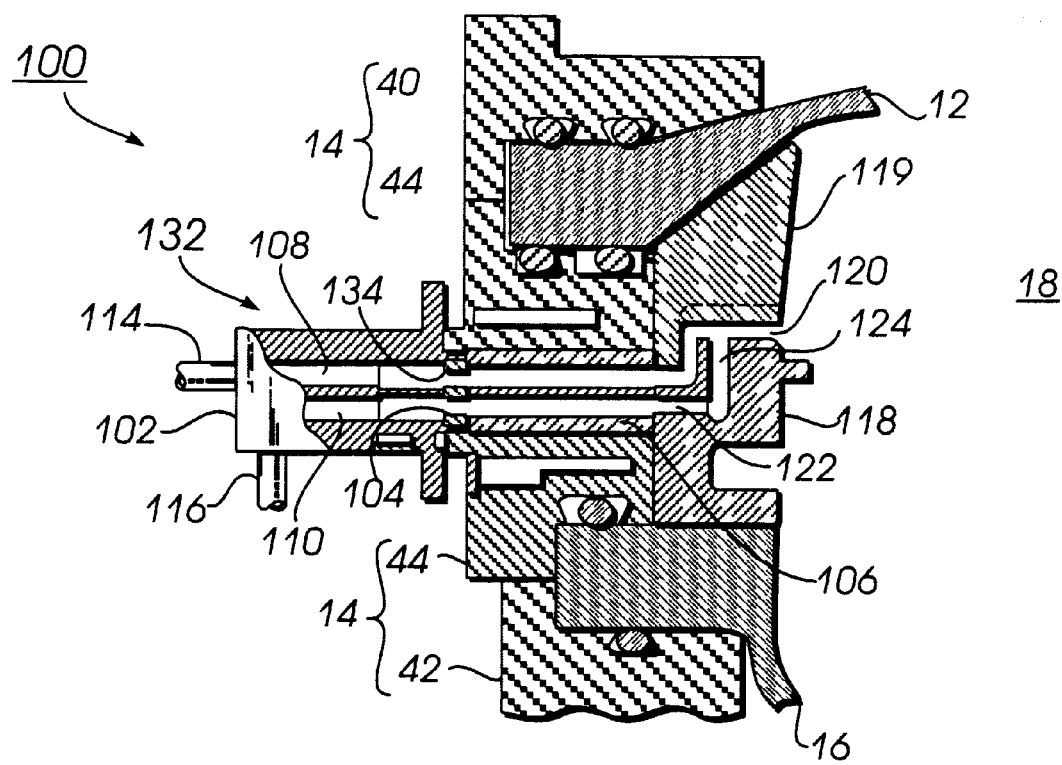
FIG. 2 is a cross section through the gas inlet manifold of one embodiment of the invention.
Figure 3:
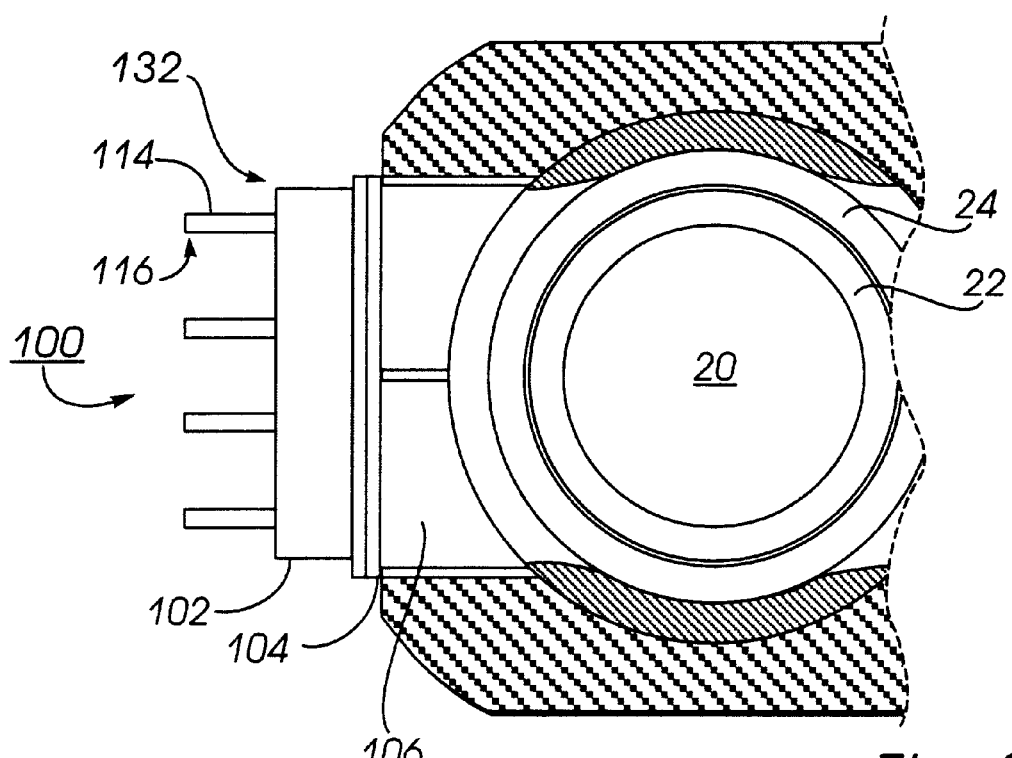
FIG. 3 is a plan view of a portion of a CVD processing chamber illustrating some of the components of the manifold of FIG. 2.
Figure 6:
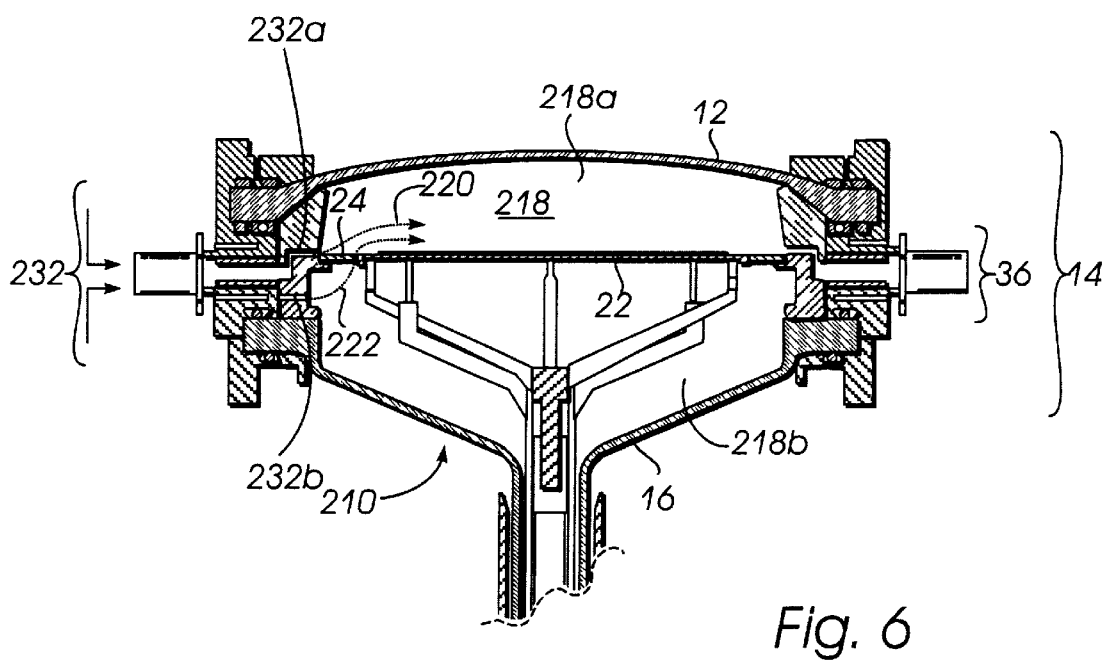
Figure 5C:
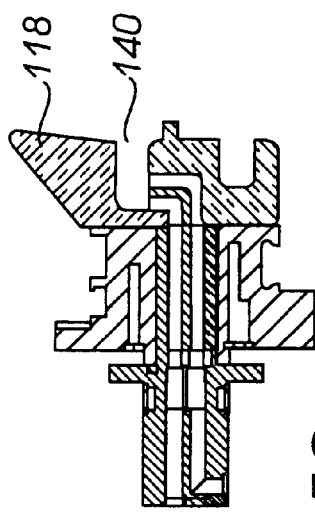
Figure 5D:
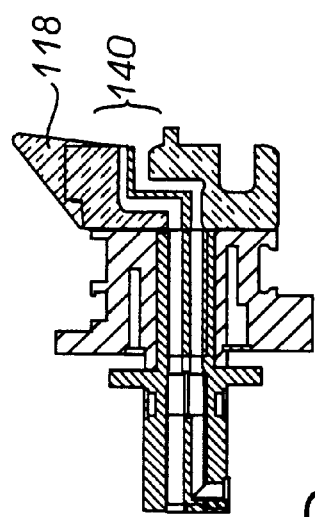
Figure 5E:
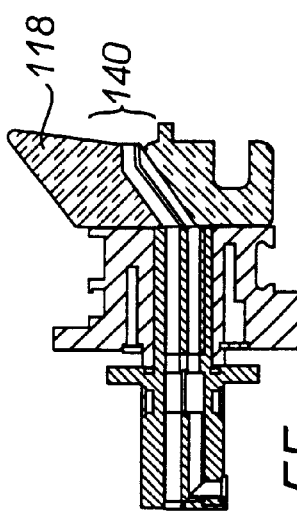
Figure 5A:
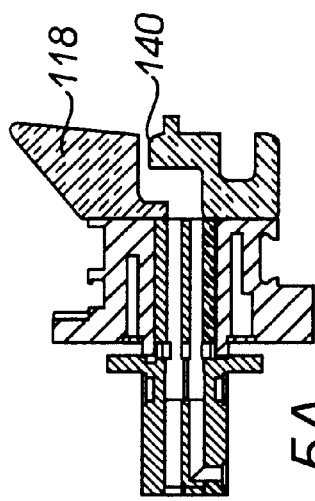
Figure 5B:
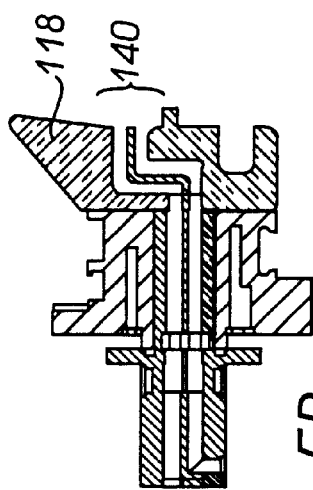
Figure 7:
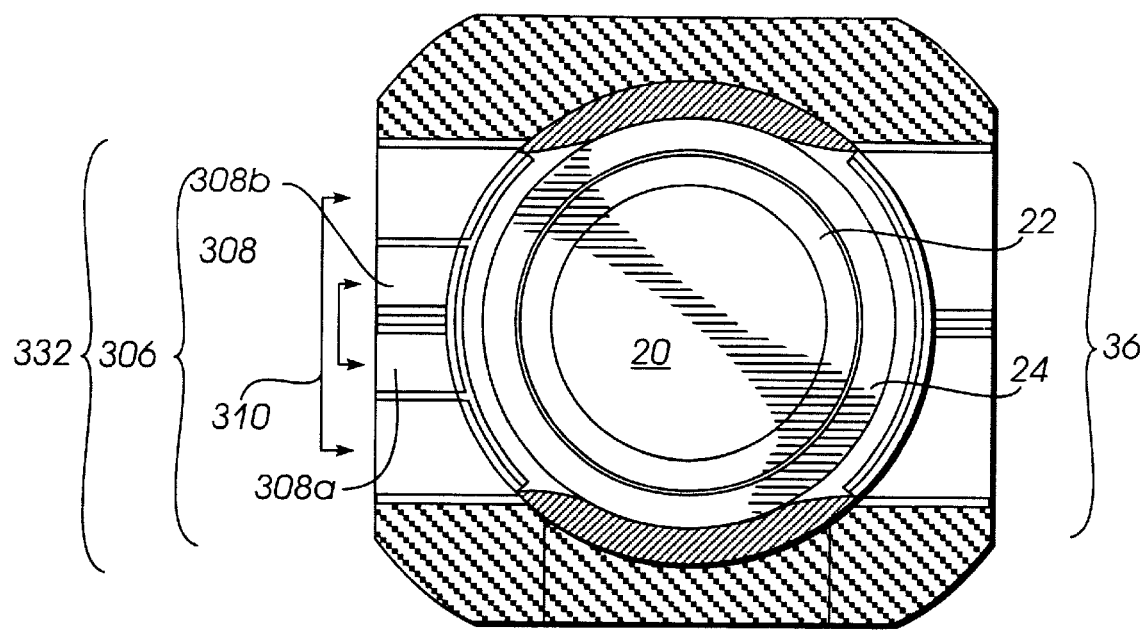
Figure 8:
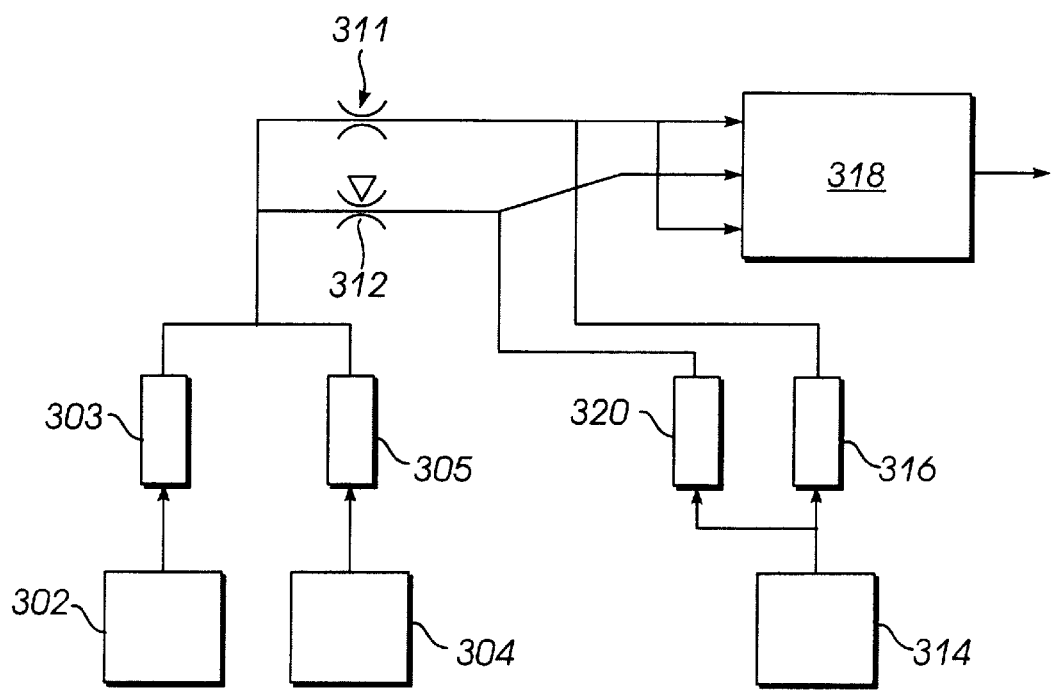

FIGS. 5(a) to 5(e) are cross sections of alternative embodiments to the manifold illustrated in FIG. 2;

FIG. 6 is a figure similar to that in FIG. 1, but showing schematically how gases can be supplied to the chamber to reduce back side wafer deposition;

FIG. 7 is a plan view similar to that in FIG. 3, showing how the manifold can be divided to make allowance for different types of gas supply; and FIG. 8 is a schematic flow diagram showing how different mixtures of gases can be regulated and supplied to an epitaxial deposition chamber.

DESCRIPTION OF THE EMBODIMENTS

Figure 4:
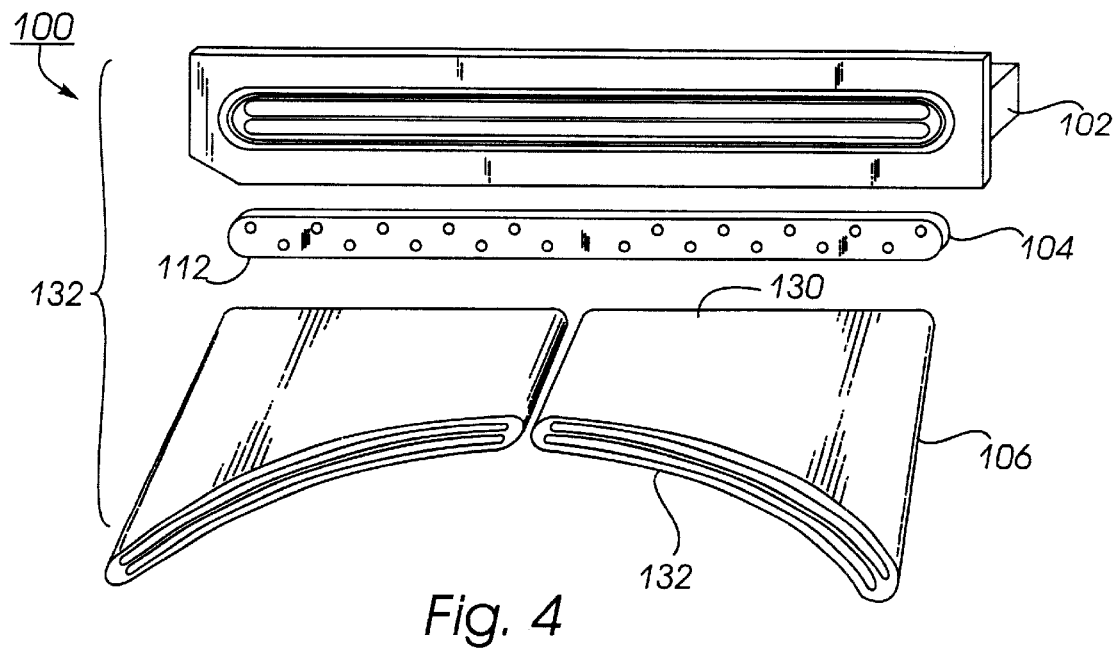
FIG. 4 is a pictorial exploded view showing some of the components of the manifold of FIG. 2.

Referring jointly to FIGS. 2, 3 and 4, the improved gas inlet manifold, generally indicated as 100 of the invention, can be seen. The manifold 100 is shown in FIGS. 2 and 3 as connected to the side wall 14 (constituted by upper and lower clamp rings 40, 42 and a base ring 44) of a semiconductor processing apparatus 18.

In all three of these figures, the manifold 100 is shown to include a connector cap 102, a diffuser plate 104 and an interface 106. The connector cap 102 and the interface 106 have upper and lower fluid passages 108 and 110 formed therein. As is apparent from FIG. 4, these upper and lower fluid passageways are oblate in cross section. The diffuser plate 104 has an upper and a lower row of circular holes 112 formed therein. When the diffuser plate 104 is in position between the connector cap 102 and the interface 106, the upper and lower rows of holes 112 correspond respectively to the upper and lower fluid passages 108 and 110. The function of these holes will be described further below.

The connector cap 102 is connected to a plurality of upper and lower gas conduits 114 and 116, respectively. Upper and lower gas conduits 114 and 116 are, in turn, part of a gas supply system (not shown) and serve to transport process gases from a gas supply to the chamber 18. Along the inside wall of the chamber 18, a circular quartz ring 118 is disposed. In the vicinity of the manifold 100, the quartz ring has upper gas and lower gas passageways 120 and 122, respectively, formed therein. Upper and lower gas passageways 120 and 122 are aligned and communicate directly with the gas passageways 108 and 110 formed in the interface 106. In the body of the quartz ring, the lower gas passageway 122 is connected to the upper gas passageway 120 by means of a vertically disposed slot 124 which, when viewed in plan, defines an arc.

In operation, process gases are supplied to the manifold 100 by means of conduits 114 and 116. These gases are kept separate and flow respectively along upper and lower conduits 108 and 110. As the gases are supplied from individual gas pipes 114 and 116 to the upper and lower conduits 108 and 110, individual streams of gases, each relating to one of the conduits 114 and 116, occur in the connector cap 102.

These gases bank up against the upstream side of the diffuser plate 104 and pass through the holes 112 formed therein. As a result of the diffuser plate, the gas streams respectively found in the upper and lower conduits 108 and 110 are broken down and form a substantially laminar flow of gas through the interface 106. When the gas in the lower conduit 110 reaches the quartz ring 118, it moves along the lower gas path 122 and up the vertically disposed slot 124 to meet and mix with the gas from the upper conduit 108. At this point, the gases have been heated to some extent by the quartz ring 118 which, in turn, has been heated by the lamps. As a result of this arrangement, the gases are preheated before mixing occurs, and undesirable crystals do not form. This mixture of gases is then able to move in a substantially laminar pattern across the preheat ring 24, the susceptor 22 and the wafer 20, to be exhausted through the exhaust 36.

As can be seen from FIGS. 3 and 4, the interface 106 has a flat upstream face 130 and a curved downstream face 132. This allows the interface 106 to provide a gas flow path between the flat-faced connector cap 102 and diffuser plate 104, on the one hand, and the circular quartz ring 118, on the other hand. In addition, FIGS. 2 and 4 show that the diffuser plate 104 fits into a recess 134 formed in the connector cap 102. As a result of this configuration, the interface 106, which is typically made of quartz, abuts against both the diffuser plate 104 and the connector cap 102.

In FIGS. 5A–5E, different configurations of channels, generally indicated as 140, are shown formed in the quartz ring 118. These channels 140 all serve approximately the same function as channels 120 and 122 shown in FIG. 2, and these figures serve to illustrate a number of different configurations of channels that can be used to allow the mixing of the gases to occur as close as possible to the interior face of the quartz ring 118. Apart from the different configurations of the channels 140, all the other components shown in FIGS. 5A–5E are identical to or similar to corresponding components illustrated in FIGS. 2 through 4. Accordingly, they have been given like reference numerals.

The embodiments illustrated in these FIGS. 2 to 5 therefore provide a solution to the problem of gases reacting spontaneously in the supply conduits and inlet manifold in the nitride deposition process described above. It will be understood that the principles illustrated in these figures could be applied to processes other than the nitride deposition process.

A different embodiment of the invention is illustrated in FIG. 6. This figure shows a typical CVD deposition chamber generally indicated as 210. As with the prior art deposition chamber 10 indicated in FIG. 1, the apparatus includes a top 12, side walls 14, and bottom 16, which together define a processing chamber 218. Inside chamber 218, a semiconductor wafer 20 is supported on a susceptor 22. A susceptor circumscribing preheat ring 24 is also shown. Processing gases are input from different sources (not shown) into chamber 218 by way of input manifold 232 and are exhausted from the chamber by means of exhaust port 36. For clarity, the heater lamps and other components of the apparatus are not illustrated.

As is apparent from this figure, the preheat ring 24 and the susceptor 22 divide the chamber 218 into upper and lower portions 218a and 218b, respectively.

This embodiment of the invention can also be used to combat the undesirable reaction between ammonia and silicon species gases in the nitride deposition process. This can be done by injecting each gas from a different source separately into one of the upper or lower portions of the chamber 218 respectively through upper and lower passageways 232a and 232b. This means that the gases do not mix until they are fully inside the chamber 218.

For example, the silicon species gas can be injected into the upper portion 218a whilst the ammonia based gas can be introduced into the lower portion 218b. If the ammonia introduced into the lower portion 218b is at a slightly higher pressure than the silicon species gas injected into the upper portion 218a, the ammonia gas will flow from the lower portion to the upper portion by way of the slit between the preheat ring 24 and the susceptor 22 in the direction of the arrows 220. Thus, both the ammonia gas and the silicon gas are heated within the chamber before they come into contact with one another. Furthermore, mixing of the gases occurs at or close to the wafer, and unwanted particle formation is reduced.

This configuration also has the advantage that the gas moving through the slit between the preheat ring 24 and the susceptor 22 prevents gases from moving from the upper portion 218a to the lower portion 218b. This restricts the amount of deposition that occurs on the back side of the susceptor 22 and the other components within the lower portion 218b of the processing apparatus 210. It is important to restrict deposition on the back side of the susceptor, as it may adversely affect temperature measurements (usually done by means of an external pyrometer) which, in turn, will adversely affect processing of the wafer 20. Deposition on the other components in the lower portion 218b is undesirable, as it could lead to particle generation if not removed. In addition, wafer transfer occurs in this lower portion 218b and substantial particle generation could adversely affect the moving parts in this portion.

This embodiment of the invention also has the advantage that it can be used to reduce the problem (as described above) associated with doped polysilicon deposition. As will be recalled, the temperature dependence of dopant incorporation is opposite to the temperature dependence of the polysilicon deposition rate. This embodiment provides the flexibility of inputting the dopant gas into the lower portion 218b and being able to independently control its flow. Therefore, an additional and independent source of control over dopant incorporation can be achieved.

The embodiment of FIG. 6 can be used in conjunction with a further system of improving the control of different types of gases flowing into the processing chamber as illustrated in FIGS. 7 and 8. These figures show only the interface connector 306, portions of the processing apparatus, the wafer 20, susceptor 22, preheat ring 24 and exhaust port 36. FIG. 7 shows only the portion of the gas inlet manifold 332 which supplies the gas to the upper portion of the processing chamber, and FIG. 8 schematically represents a gas control system.

The interface connector 306 is shown to be constituted by a central zone 308 and an outer zone 310. According to this embodiment of the invention and as further illustrated in FIG. 8, the composition of the gas which flows into the central zone 308 can be controlled independently of the composition of the gas which flows into the outer zone 310. In addition, the flow rate of the gas to either of the two halves 308a and 308b of the central zone can further be controlled independently from one another. This provides two degrees of control for the gas flow system for the purpose of controlling the composition of any layer deposited on the semiconductor wafer 20. In addition, the chamber heating system provides the third control variable (i.e., temperature). As in the past, the susceptor 22 can be rotated to improve the uniformity of the deposition on the wafer 20.

Turning now to the diagram in FIG. 8, it can be seen that a gas containing silicon, together with a hydrogen carrier gas, is fed to the chamber 318 from containers 302 and 304 by means of independent mass flow controllers 303 and 305. This gas mixture flows through two bellows metering valves 311 and 312 which operate as variable restrictors to apportion the main flow of silicon bearing gas between the central and outer zones 308 and 310, respectively. In addition, a gas which is a dopant source (such as diborane diluted in hydrogen) is fed from storage 314 into two different mass flow controllers 316 and 320 and then metered into the silicon source downstream of the bellows metering valves 311 and 312.

As a result of this configuration, separate control of the dopant gas concentration flowing into the central zone 308 and the outer zone 310, respectively, can be achieved.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of supplying processing fluid to a substrate processing apparatus said method comprising the steps of:
    (a) providing a processing fluid to a gas inlet manifold comprising a central zone and an outer zone wherein said gas inlet manifold is disposed adjacent to a substrate processing area;
    (b) controlling the flow of processing fluids provided to said central zone of said gas inlet manifold and flowing the processing fluids from said central zone in a substantially laminar pattern over said substrate processing area; and
    (c) controlling the flow of processing fluids provided to said outer zone of said gas inlet manifold and flowing the processing fluids from said outer zone in a substantially laminar pattern over the substrate processing area.

2. The method of claim 1 wherein the flow rate of the processing fluid provided to said central zone of said gas inlet manifold is greater than the flow rate of the processing fluid provided to said outer zone of said gas inlet manifold.

3. The method of claim 2 wherein said processing fluids comprise silicon.

4. The method of claim 2 wherein said processing fluids comprise a dopant.

5. The method of claim 1 wherein the flow rate of the processing fluid provided to said central zone of said gas inlet manifold is less than the flow rate of the processing fluid provided to said outer zone of said gas inlet manifold.

6. The method of claim 5 wherein said processing fluids comprises silicon.

7. The method of claim 5 wherein said processing fluids comprises a dopant.

8. The method of claim 5 wherein said processing fluids comprises silicon.

9. The method of claim 1 wherein said processing fluids comprises a dopant.

10. A method for supplying fluid to a substrate processing apparatus comprising the steps of:
   (a) providing a silicon comprising fluid to a gas inlet manifold interfacing connector comprising a central zone and an outer zone wherein said gas inlet manifold is disposed adjacent to a substrate processing area;
   (b) controlling the ratio of silicon available to the central zone of said gas inlet manifold relative to the amount of silicon available to the outer zone of said gas inlet manifold wherein more silicon is available to said central zone of said gas inlet manifold; and
   (c) flowing said silicon comprising fluid from said central zone and said outer zone over said substrate processing area in a substantially laminar pattern.

11. A method for supplying fluid to a substrate processing apparatus comprising the steps of:
   (a) providing a silicon comprising fluid to a gas inlet manifold comprising a central zone and an outer zone wherein said gas inlet manifold is disposed adjacent to a substrate processing area;
   (b) controlling the ratio of silicon available to the central zone of said gas inlet manifold relative to the amount of silicon available to the outer zone of said gas inlet manifold wherein less silicon is available to said central zone of said gas inlet manifold; and
   (c) flowing said silicon comprising fluid from said central zone and said outer zone over the substrate processing area in a substantially laminar pattern.

12. A method for supplying processing fluid to a substrate processing apparatus comprising the steps of:
   (a) providing a dopant comprising fluid to a gas inlet manifold comprising a central zone and an outer zone wherein said gas inlet manifold is disposed adjacent to a substrate processing area;
   (b) controlling the ratio of dopant available to the central zone of said gas inlet manifold relative to the amount of dopant available to the outer zone of said gas inlet manifold wherein more dopant is available to said central zone of said gas inlet manifold; and
   (c) flowing said dopant comprising fluid from said central zone and said outer zone over the substrate processing area in a substantially laminar pattern.

13. A method for supplying processing fluid to a substrate processing apparatus comprising the steps of:
   (a) providing a dopant comprising fluid to a gas inlet manifold comprising a central zone and an outer zone wherein said gas inlet manifold is disposed adjacent to a substrate processing area;
   (b) controlling the ratio of dopant available to the central zone of said gas inlet manifold relative to the amount of dopant available to the outer zone of said gas inlet manifold wherein less dopant is available to said central zone of said gas inlet manifold; and
   (c) flowing said dopant comprising fluid from said central zone and said outer zone over the substrate processing area in a substantially laminar pattern.

14. A method for supplying a processing fluid to a substrate processing apparatus, said method comprising the steps of:
   (a) providing a substrate processing area;
   (b) providing a gas inlet manifold comprising a central zone and an outer zone, wherein said gas inlet manifold is disposed adjacent to said substrate processing area;
   (c) providing an exhaust port wherein said exhaust port is disposed adjacent to said substrate processing area and opposite said gas inlet manifold;
   (d) flowing at least one processing fluid each through said central zone and said outer zone of said gas inlet manifold;
   (e) independently controlling the flow of processing fluids through said central zone and said outer zone of said gas inlet manifold; and
   (f) directing the flow of processing fluids through said central zone and said outer zone of said gas inlet manifold, across said substrate processing area, and into said exhaust port.

15. The method of claim 14 wherein the flow rate of the processing fluid provided to said central zone of said gas inlet manifold is greater than the flow rate of the processing fluid provided to said outer zone of said gas inlet manifold.

16. The method of claim 14 wherein the flow rate of the processing fluid provided to said central zone of said gas inlet manifold is less than or equal to the flow rate of the processing fluid provided to said outer zone of said gas inlet manifold.

17. The method of claim 14 wherein the processing fluids provided to said central zone and said outer zone of said gas inlet manifold include silicon, and further comprising controlling the silicon content of said processing fluids such that the silicon content of the processing fluid provided to said central zone of said gas inlet manifold is higher than the silicon content of the processing fluid provided to said outer zone of said gas inlet manifold.

18. The method of claim 14 wherein the processing fluids provided to said central zone and said outer zone of said gas inlet manifold include silicon, and further comprising controlling the silicon content of said processing fluids such that the silicon content of the processing fluid provided to said central zone of said gas inlet manifold is less than or equal to the silicon content of the processing fluid provided to said outer zone of said gas inlet manifold.

19. The method of claim 14 wherein the processing fluids provided to said central zone and said outer zone of said gas inlet manifold include a dopant, and further comprising controlling the dopant content of said processing fluids such that the dopant content of the processing fluid provided to said central zone of said gas inlet manifold is higher than the dopant content of the processing fluid provided to said outer zone of said gas inlet manifold.

20. The method of claim 14 wherein the processing fluids provided to said central zone and said outer zone of said gas inlet manifold include a dopant, and further comprising controlling the dopant content of said processing fluids such that the dopant content of the processing fluid provided to said central zone of said gas inlet manifold is less than or equal to the dopant content of the processing fluid provided to said outer zone of said gas inlet manifold.

21. A method for supplying processing fluid to a substrate processing apparatus, said method comprising the steps of:

(a) providing a substrate processing chamber;

(b) providing a substrate supporting susceptor disposed within said substrate processing chamber, wherein said substrate supporting susceptor divides said substrate processing chamber into an upper portion and a lower portion;

(c) providing a gas inlet manifold comprising an upper zone and a lower zone, wherein said lower zone of said gas inlet manifold is coupled to said lower portion of said substrate processing chamber, and wherein said upper zone of said gas inlet manifold further comprises a central zone and an outer zone, said central zone and said outer zone being coupled to said upper portion of said processing area;

(d) providing a first processing fluid to said lower zone of said gas inlet manifold and controlling the flow of said first processing fluid; and (e) providing a second processing fluid to said central zone of said gas inlet manifold and controlling the flow of said second processing fluid (f) providing a third processing fluid to said outer zone of said gas inlet manifold and controlling the flow of said third processing fluid.

* * * * *